(12) United States Patent
Takahashi et al.

(10) Patent No.: US 9,629,250 B2
(45) Date of Patent: Apr. 18, 2017

(54) METHOD OF MANUFACTURING GLASS COMPONENT, GLASS COMPONENT, AND GLASS INTERPOSER

(71) Applicant: Asahi Glass Company, Limited, Chiyoda-ku (JP)

(72) Inventors: Shintaro Takahashi, Chiyoda-ku (JP); Motoshi Ono, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/679,237

(22) Filed: Apr. 6, 2015

(65) Prior Publication Data
US 2015/0313020 A1  Oct. 29, 2015

(30) Foreign Application Priority Data
Apr. 28, 2014 (JP) ................. 2014-092876

(51) Int. Cl.
| | |
|---|---|
| H05K 3/00 | (2006.01) |
| H05K 1/11 | (2006.01) |
| H05K 1/03 | (2006.01) |
| C03C 15/00 | (2006.01) |
| C03C 23/00 | (2006.01) |

(52) U.S. Cl.
CPC ............. *H05K 3/007* (2013.01); *C03C 15/00* (2013.01); *C03C 23/0025* (2013.01); *H05K 1/0306* (2013.01); *H05K 1/115* (2013.01); *H05K 3/0047* (2013.01); *H05K 2201/10378* (2013.01)

(58) Field of Classification Search
CPC ....... H05K 3/007; H05K 1/0306; H05K 1/115
See application file for complete search history.

(56) References Cited

U.S. PATENT DOCUMENTS

| 5,480,503 A * | 1/1996 | Casey | H01L 21/4857 |
| | | | 156/235 |
| 6,791,171 B2 * | 9/2004 | Mok | G01R 1/06711 |
| | | | 257/678 |
| 7,863,524 B2 * | 1/2011 | Shioga | H05K 1/162 |
| | | | 174/260 |
| 8,157,945 B2 * | 4/2012 | Higuchi | B32B 7/06 |
| | | | 156/247 |
| 8,362,364 B2 * | 1/2013 | Asano | H01L 21/563 |
| | | | 174/260 |

(Continued)

*Primary Examiner* — Nathan Milakovich
(74) *Attorney, Agent, or Firm* — Oblon, McClelland, Maier & Neustadt, L.L.P.

(57) ABSTRACT

A method of manufacturing a glass component includes preparing a glass substrate having a thickness greater than or equal to 300 μm, forming first electric wires on a first surface of the glass substrate, forming a structure by joining the glass substrate via a resin layer to a support substrate such that the first surface of the glass substrate faces the resin layer, thinning the glass substrate from a second surface of the glass substrate to a thickness between 10 μm and 80 μm, forming through holes in the glass substrate by irradiating the glass substrate from the second surface with a laser beam, forming second electric wires on the second surface of the glass substrate such that the second electric wires are electrically connected to the corresponding first electric wires via conductors filling the through holes, and separating the glass substrate from the support substrate.

10 Claims, 9 Drawing Sheets

(56) References Cited

U.S. PATENT DOCUMENTS

| | | | | |
|---|---|---|---|---|
| 8,377,552 | B2* | 2/2013 | Kondo | B32B 7/06 156/329 |
| 2004/0217455 | A1* | 11/2004 | Shiono | H01L 21/486 257/678 |
| 2009/0324939 | A1* | 12/2009 | Feinstein | B24B 7/242 428/337 |
| 2011/0026236 | A1* | 2/2011 | Kondo | B32B 7/06 361/820 |
| 2012/0048604 | A1* | 3/2012 | Cornejo | C03C 15/00 174/258 |
| 2012/0202030 | A1* | 8/2012 | Kondo | B32B 17/06 428/215 |
| 2013/0174417 | A1* | 7/2013 | Yu | H01L 23/15 29/852 |
| 2014/0217075 | A1* | 8/2014 | Takahashi | H05K 3/0029 219/121.71 |
| 2015/0069628 | A1* | 3/2015 | Tseng | H01L 23/49827 257/774 |
| 2015/0173191 | A1* | 6/2015 | Takahashi | H01L 23/15 174/255 |
| 2015/0264475 | A1* | 9/2015 | Link | H04R 3/00 381/312 |
| 2015/0319852 | A1* | 11/2015 | Min | H05K 1/0306 361/784 |

* cited by examiner

METHOD OF MANUFACTURING GLASS COMPONENT, GLASS COMPONENT, AND GLASS INTERPOSER

CROSS-REFERENCE TO RELATED APPLICATION

The present application is based upon and claims the benefit of priority of Japanese Patent Application No. 2014-092876, filed on Apr. 28, 2014, the entire contents of which are incorporated herein by reference.

BACKGROUND OF THE INVENTION

1. Field of the Invention

An aspect of this disclosure relates to a glass component such as a glass interposer and a method of manufacturing the glass component.

2. Description of the Related Art

In the field of semiconductor devices, a glass interposer is drawing attention as a component that makes it possible to further reduce the size of a semiconductor device. In a glass interposer, for example, electric wires on the opposing surfaces of a glass substrate are electrically connected to each other via a through hole formed in the glass substrate.

A glass interposer may be manufactured by forming a through hole in a glass substrate, and then forming electric wires on the opposing surfaces of the glass substrate such that they are connected to each other via the through hole.

To date, the thickness of a glass substrate of a glass interposer has been reduced to about 300 μm. Also, with an increasing demand for smaller semiconductor devices and thinner, space-saving electronic components, it is desired to further reduce the thickness of a glass substrate of a glass interposer.

However, using a thinner glass substrate for a glass interposer may reduce the dimensional accuracy of electric wires formed on surfaces of the glass substrate. This is because a thin glass substrate is easily influenced by, for example, the vibration of a processing apparatus and flexure, and the dimensional stability of electronic wires formed on surfaces of such a thin glass substrate is poor.

Thus, it is difficult to accurately form fine electric wires at desired positions on surfaces of a thin glass substrate.

SUMMARY OF THE INVENTION

In an aspect of this disclosure, there is provided a method of manufacturing a glass component. The method includes, in the following order, preparing a glass substrate including a first surface and a second surface and having a thickness greater than or equal to 300 μm, forming first electric wires on the first surface of the glass substrate, forming a structure by joining the glass substrate via a resin layer to a support substrate such that the first surface of the glass substrate faces the resin layer, thinning the glass substrate from the second surface to a thickness between 10 μm and 80 μm, forming through holes in the glass substrate by irradiating the glass substrate from the second surface with a laser beam, forming second electric wires on the second surface of the glass substrate such that the second electric wires are electrically connected to the corresponding first electric wires via conductors filling the through holes, and separating the glass substrate from the support substrate.

DESCRIPTION OF THE PREFERRED EMBODIMENTS

In the present application, a component such as a glass interposer, where electric wires formed on the opposing surfaces of a glass substrate are electrically connected to each other via a through hole formed in the glass substrate, may be referred to as a "glass component". A glass interposer is an example of a glass component.

Embodiments of the present invention are described below with reference to the accompanying drawings.

<<Method of Manufacturing Glass Component>>

Figure 1:
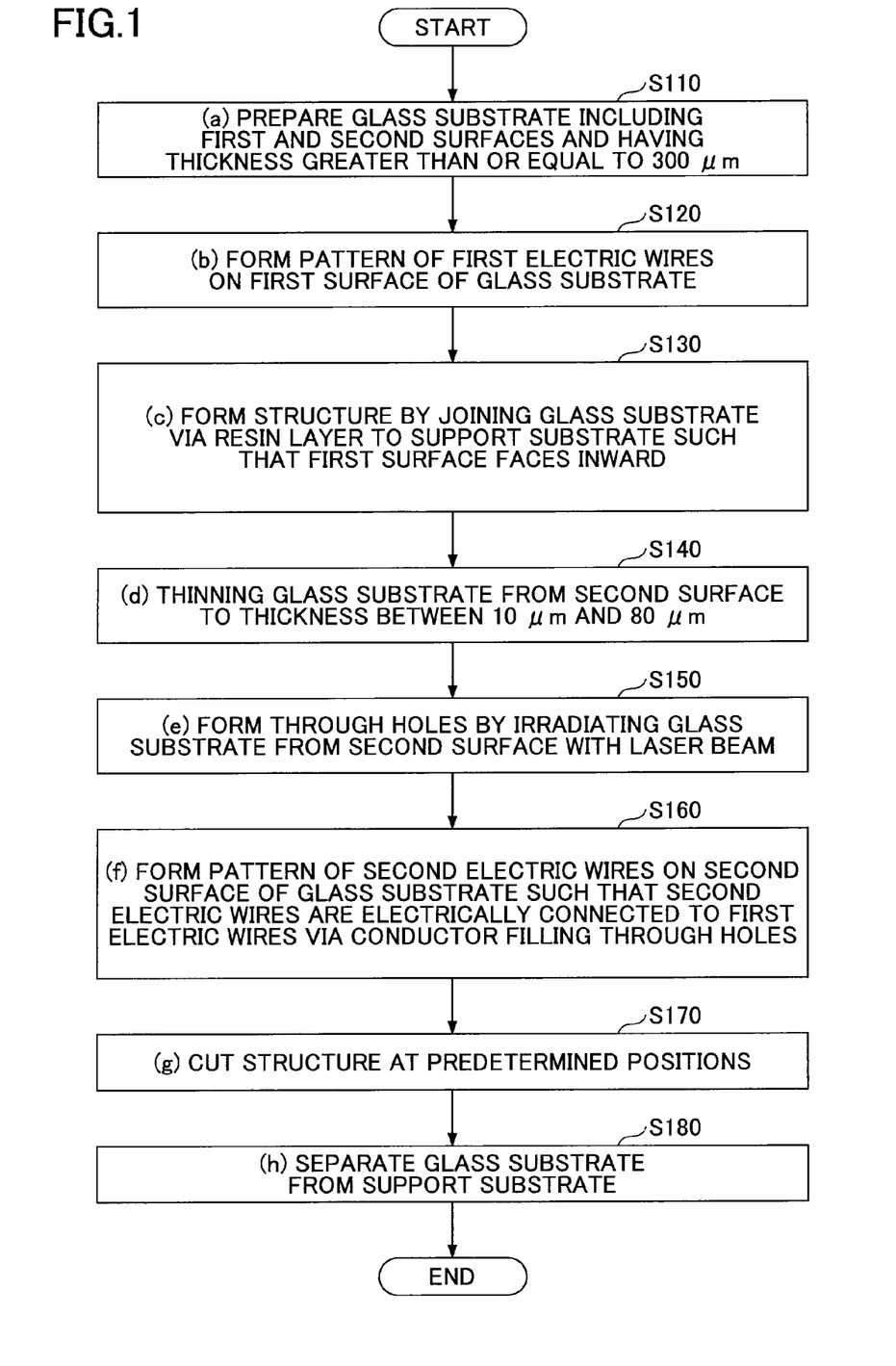
FIG. 1 is a flowchart illustrating an exemplary method of manufacturing a glass component.

FIG. 1 is a flowchart illustrating an exemplary method of manufacturing a glass component according to an embodiment.

As illustrated by FIG. 1, the manufacturing method of the present embodiment includes:

(a) preparing a glass substrate including first and second surfaces and having a thickness greater than or equal to 300 μm (step S110);

(b) forming a pattern of first electric wires on the first surface of the glass substrate (step S120);

(c) forming a structure by joining the glass substrate via a resin layer to a support substrate such that the first surface of the glass substrate faces inward (or the first surface faces the resin layer) (step S130);

(d) thinning (i.e., reducing the thickness of) the glass substrate from the second surface to a thickness between 10 μm and 80 μm (step S140);

(e) forming through holes in the glass substrate by irradiating the glass substrate from the second surface with a laser beam (step S150);

(f) forming a pattern of second electric wires on the second surface of the glass substrate such that the second electric wires are electrically connected to the corresponding first electric wires via conductors filling the through holes (step S160);

(g) cutting the structure at predetermined positions (step S170); and (h) separating the glass substrate from the support substrate (step S180).

In the above method, step S170 is an optional step. When, for example, the structure already has desired dimensions and it is not necessary to cut the structure, step S170 may be omitted. Also, step S170 may be performed after step S180.

Each of the steps is described in more detail below with reference to FIGS. 2 through 13. FIGS. 2 through 13 are drawings illustrating the respective steps in the manufacturing method of the present embodiment.

<Step S110>

First, a glass substrate is prepared. Any appropriate type of glass substrate may be used.

The glass substrate has a thickness greater than or equal to 300 µm. The thickness of the glass substrate is preferably less than or equal to 1000 µm (1 mm), and more preferably between 300 µm and 700 µm.

When the thickness of the glass substrate is less than 300 µm, the dimensional stability of the glass substrate is reduced due to the influence of, for example, the vibration of a processing apparatus and flexure of the glass substrate itself. Accordingly, when the thickness of the glass substrate is less than 300 µm, it becomes difficult to accurately form fine electric wires at desired positions on the surfaces of the glass substrate at later wiring steps (step S120 and/or step S160). On the other hand, when the thickness of the glass substrate is greater than 1000 µm, the efficiency of a later glass-substrate thinning step (step S140) is reduced.

The shape of the glass substrate is not limited to any specific shape. For example, the glass substrate may have a disk shape, a square shape, or a rectangular shape.

Figure 2:
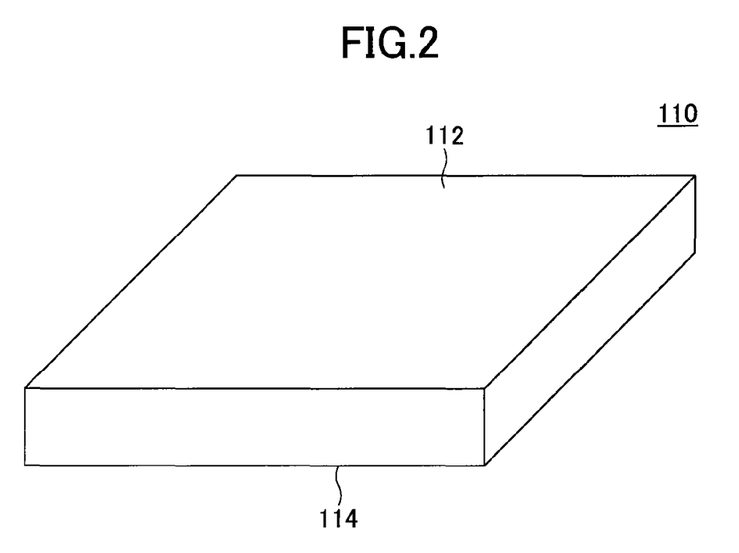
FIG. 2 is a drawing illustrating an exemplary glass substrate.

In the example of FIG. 2, a glass substrate 110 has a rectangular shape. The glass substrate 110 includes a first surface 112 and a second surface 114.

<Step S120>

Next, a pattern of first electric wires 125 is formed on one surface (e.g., the first surface 112) of the glass substrate 110 prepared at step S110.

Step S120 is described below with reference to FIGS. 3 through 5.

Figure 3:
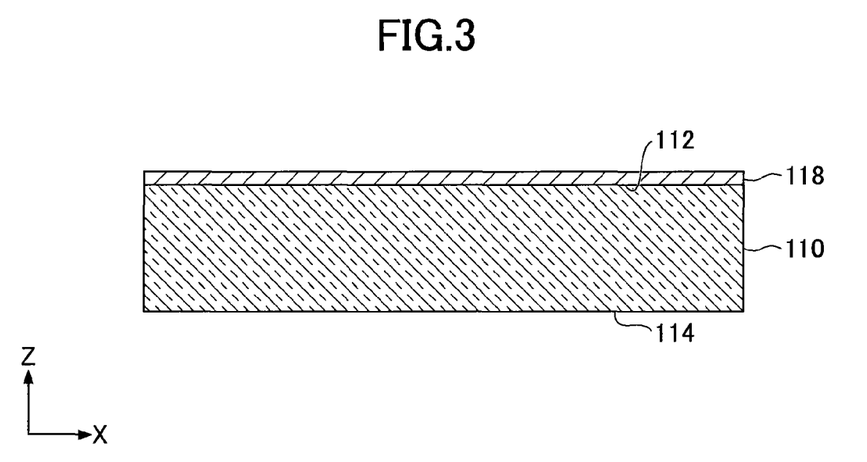
FIG. 3 is a drawing illustrating a step in the exemplary method of manufacturing a glass component.
Figure 4:
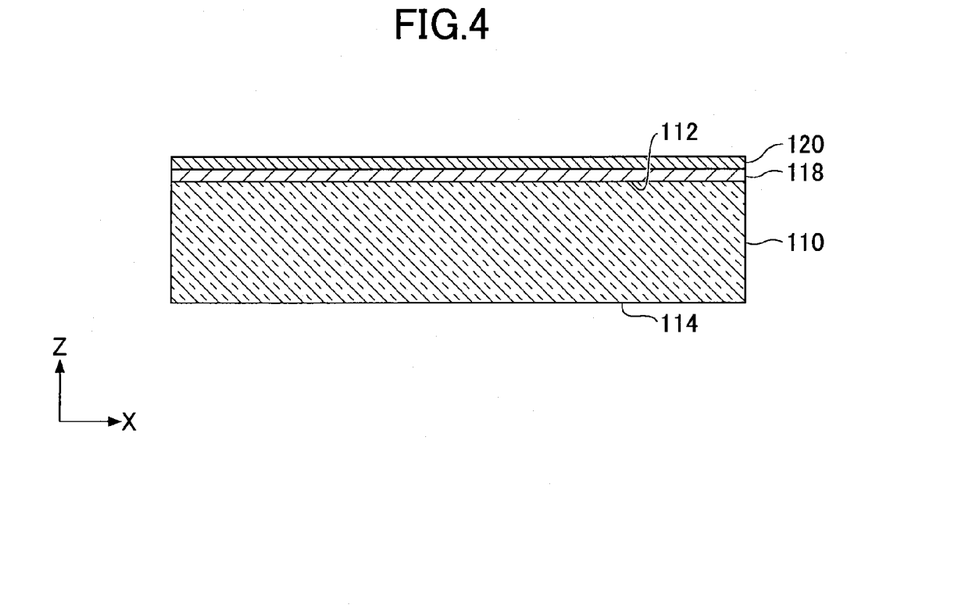
FIG. 4 is a drawing illustrating a step in the exemplary method of manufacturing a glass component.
Figure 5:
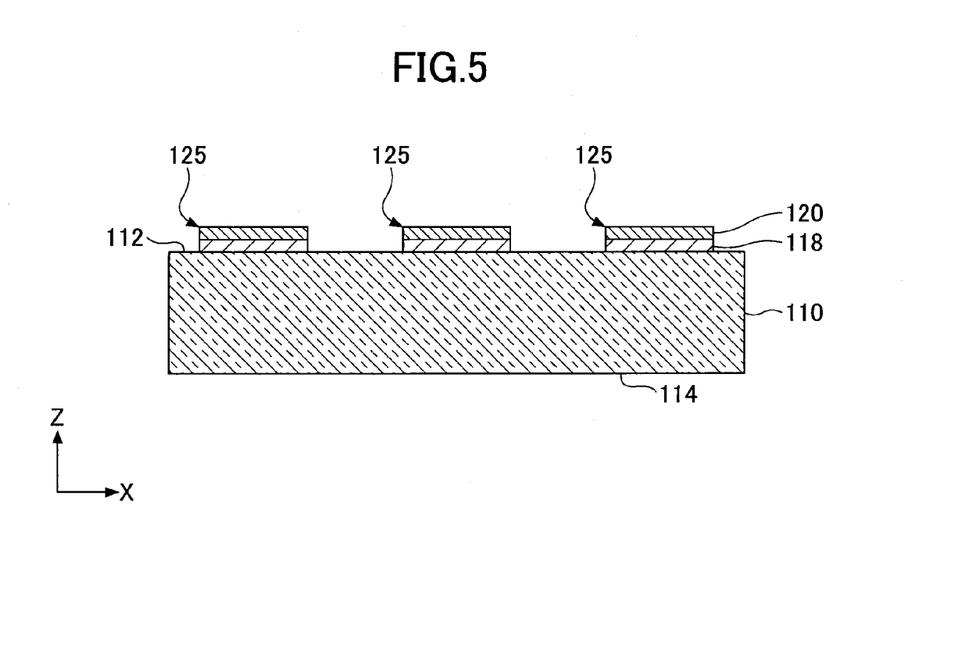
FIG. 5 is a drawing illustrating a step in the exemplary method of manufacturing a glass component.

FIGS. 3 through 5 illustrate step S120 where the first electric wires 125 are formed on the first surface 112 of the glass substrate 110.

As illustrated by FIG. 3, a first seed layer 118 is formed on the first surface 112 of the glass substrate 110.

Any appropriate material may be used for the first seed layer 118 as long as the material has good adhesion to a conductive layer to be formed on the first seed layer 118. For example, the first seed layer 118 may be comprised of a metal, a semiconductor, or an oxide. The oxide may be a conductive oxide.

The first seed layer 118 may be formed by a standard film forming method such as sputtering. Alternatively, the first seed layer 118 may be formed on the first surface 112 of the glass substrate 110 by electroless plating.

The thickness of the first seed layer 118 is not limited to a specific value. For example, the first seed layer 118 may have a thickness between 100 nm and 1000 nm.

Next, as illustrated by FIG. 4, a first conductive layer 120 is formed on the first seed layer 118.

For example, the first conductive layer 120 may be comprised of a metal, a semiconductor, or an oxide (conductive oxide). Examples of metals include copper (including an alloy) and nickel (including an alloy). Examples of oxides include indium tin oxide (ITO).

The first conductive layer 120 may be formed by any film forming method. When the first seed layer 118 is comprised of a conductive material and the first conductive layer 120 is comprised of a metal, the first conductive layer 120 may be formed by electrolytic plating.

The thickness of the first conductive layer 120 is not limited to a specific value. For example, the first conductive layer 120 may have a thickness between 0.5 µm and 10 µm.

Next, as illustrated by FIG. 5, the first conductive layer 120 is patterned (together with the first seed layer 118) to form a pattern of the first electric wires 125 on the first surface 112.

The first conductive layer 120 may be patterned using a known wiring patterning technique. For example, the first conductive layer 120 may be patterned by lithography using a resist.

Here, at the stage where the first conductive layer 120 is patterned, the glass substrate 110 still has a thickness greater than or equal to 300 µm. Therefore, the above described problem, where the dimensional stability of the glass substrate 110 is reduced due to the influence of, for example, the vibration of a processing apparatus and flexure of the glass substrate 110 itself, hardly occurs.

Accordingly, with the manufacturing method of the present embodiment, it is possible to accurately form a fine pattern of the first electric wires 125 on the first surface 112 of the glass substrate 110.

The width of each first electric wire 125 (the length in the X direction in FIG. 5) may be, for example, between 2 µm and 5 µm. Also, the distance between adjacent first electric wires 125 may be, for example, between 2 µm and 5 µm.

In the above example, as illustrated by FIG. 4, the first conductive layer 120 is formed on the first seed layer 118 after the first seed layer 118 is formed. However, this is just an example, and the first conductive layer 120 may be formed directly on the first surface 112 of the glass substrate 110. In this case, the first electric wire 125 does not include the first seed layer 118, and includes only the first conductive layer 120.

Also in this case, the first conductive layer 120 may be formed on the first surface 112 of the glass substrate 110 by, for example, electroless plating.

<Step S130>

Next, the glass substrate 110 including the first electric wires 125 is joined to a support substrate to form a structure.

Figure 6:
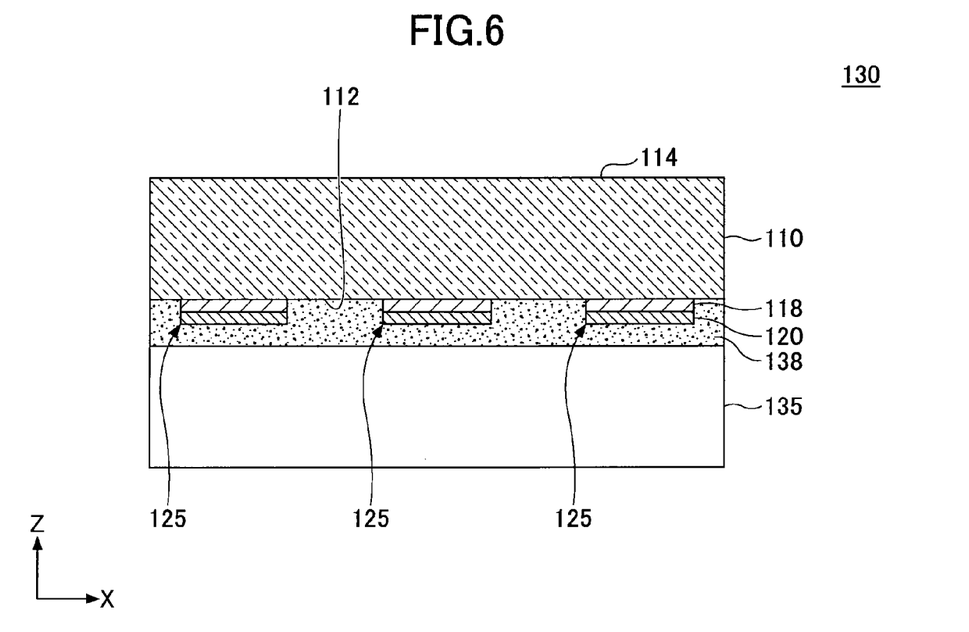
FIG. 6 is a drawing illustrating a step in the exemplary method of manufacturing a glass component.

FIG. 6 illustrates an exemplary structure 130. As illustrated by FIG. 6, the structure 130 is formed by joining the glass substrate 110 via a resin layer 138 to a support substrate 135. The glass substrate 110 is joined to the support substrate 135 such that the first surface 112, on which the first electric wires 125 are formed, is positioned closer to the support substrate 135 (or such that the first surface 112 faces the resin layer 138).

The resin layer 138 is preferably comprised of, but is not limited to, a resin that has high adhesion after the glass substrate 110 is joined to the support substrate 135, and that can be easily removed mechanically, thermally, or by ultraviolet or laser irradiation. Using such a resin for the resin layer 138 makes it possible to easily remove the glass substrate 110 from the support substrate 135 at a later step.

Also, when there is a possibility that the structure 130 is to be heat-treated at a later step, the resin layer 138 preferably has a heat resistance property (up to about 300° C.). The material of the resin layer 138 is preferably selected from, for example, silicone resin, polyimide resin, and acrylic resin.

The thickness (maximum thickness) of the resin layer 138 may be, but is not limited to, between 5 µm and 100 µm.

The support substrate 135 may be comprised of any material such as metal, resin, ceramic, or glass. However, when there is a possibility that the structure 130 is heat-treated at a later step, the support substrate 135 preferably has a heat resistance property (up to about 300° C.).

The thickness of the support substrate 135 is not limited to any specific value as long as the total thickness of the structure 130 becomes greater than or equal to 500 µm. For example, the support substrate 135 may have a thickness between 0.3 mm and 0.7 mm.

<Step S140>

Next, the thickness of the glass substrate 110 of the structure 130 is reduced (i.e., the glass substrate 110 is thinned).

Figure 7:
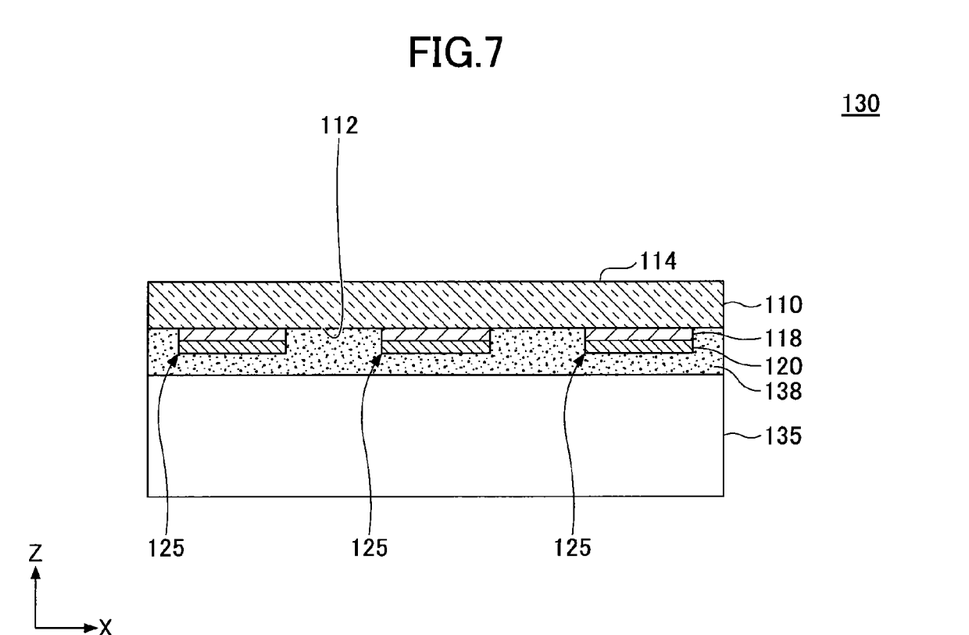
FIG. 7 is a drawing illustrating a step in the exemplary method of manufacturing a glass component.

FIG. 7 illustrates a cross section of the structure 130 after step S140. As illustrated by FIG. 7, at step S140, the thickness of the glass substrate 110 is reduced from the second surface 114.

The thickness of the glass substrate 110 may be reduced, for example, by a normal etching process or mechanical polishing.

The reduced thickness of the glass substrate 110 is preferably between 10 µm and 80 µm, and more preferably between 30 µm and 60 µm.

<Step S150>

Next, one or more through holes are formed in the glass substrate 110 of the structure 130 with the reduced thickness.

Before step S150, a second seed layer 140 may be formed on the second surface 114 of the glass substrate 110. The second seed layer 140 may be formed by a method similar to the method used to form the first seed layer 118. Also, the second seed layer 140 may be made of the same material as the first seed layer 118. Formation of the second seed layer 140 is optional.

Figure 8:
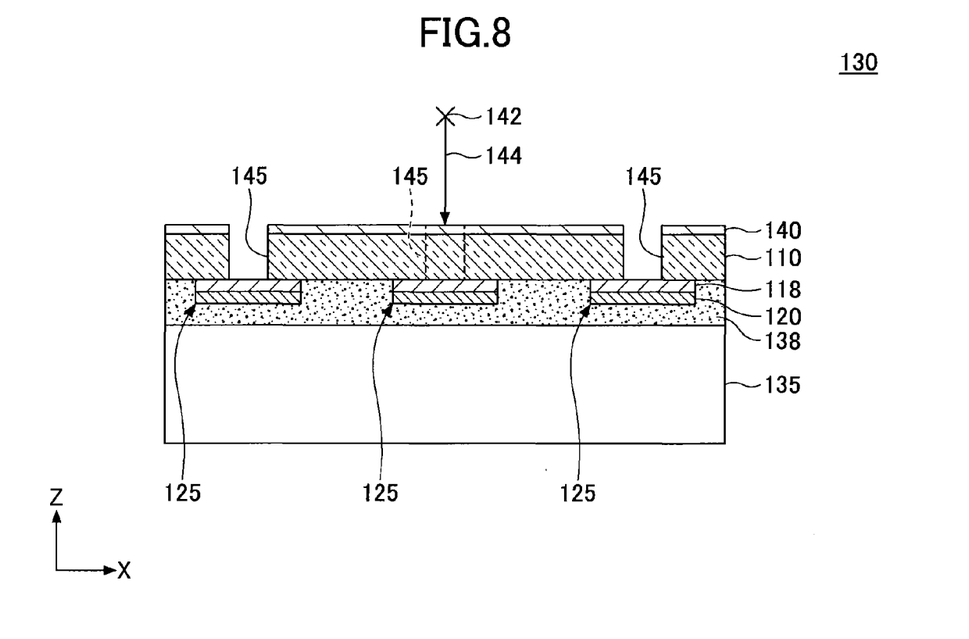
FIG. 8 is a drawing illustrating a step in the exemplary method of manufacturing a glass component.

In FIG. 8, multiple through holes are formed in the glass substrate 110. As illustrated by FIG. 8, at step S150, a laser beam 144 is emitted from a laser source 142 toward the second surface 114 of the glass substrate 110 of the structure 130.

The second seed layer 140 (if it is present) and the glass substrate 110 in areas irradiated by the laser beam 144 are fused (or melted by heat), and through holes 145 are formed in the irradiated areas.

Because the thickness of the glass substrate 110 has been sufficiently reduced at step S140, the through holes 145 can be efficiently formed at step S150.

The laser source 142 may be, but is not limited to, an excimer laser.

Generally, when seen in the thickness direction of the structure 130, the through holes 145 are formed such that the through holes 145 overlap areas where the first electric wires 125 are formed.

Also, as illustrated in FIG. 8, each through hole 145 is preferably formed to pass through the glass substrate 110, but to not pass through the first conductive layer 120 of the first electric wire 125. Forming the through holes 145 as described above makes it easier to electrically connect second electric wires formed at a later step (step S160) via the though holes 145 to the first electric wires 125.

When the first seed layer 118 of the first electric wire 125 is comprised of an insulator, it is necessary to form the through holes 145 to pass through the first seed layer 118.

The through holes 145, which do not pass through the first conductive layer 120, can be properly formed by determining, in advance, the relationship between irradiation time of the laser beam 144 and a processing depth.

In the manufacturing method of the present embodiment, however, forming the through holes 145 to not pass through the first conductive layer 120 is not essential, and the through holes 145 may be formed to pass through the first conductive layer 120. In this case, at a later step of filling the through holes 125 with conductors, parts of the through holes 125 passing through the first conductive layer 120 are also filled with the conductors.

<Step S160>

Next, second electric wires 155 are formed on the second surface 114 of the glass substrate 110.

Step S160 is described below with reference to FIGS. 9 through 11.

Figure 9:
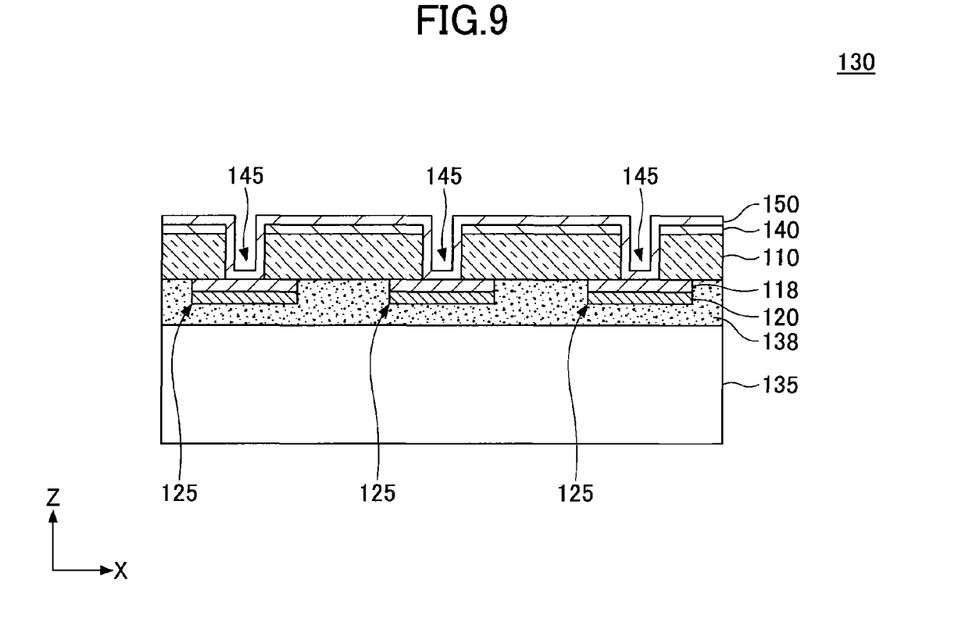
FIG. 9 is a drawing illustrating a step in the exemplary method of manufacturing a glass component.
Figure 10:
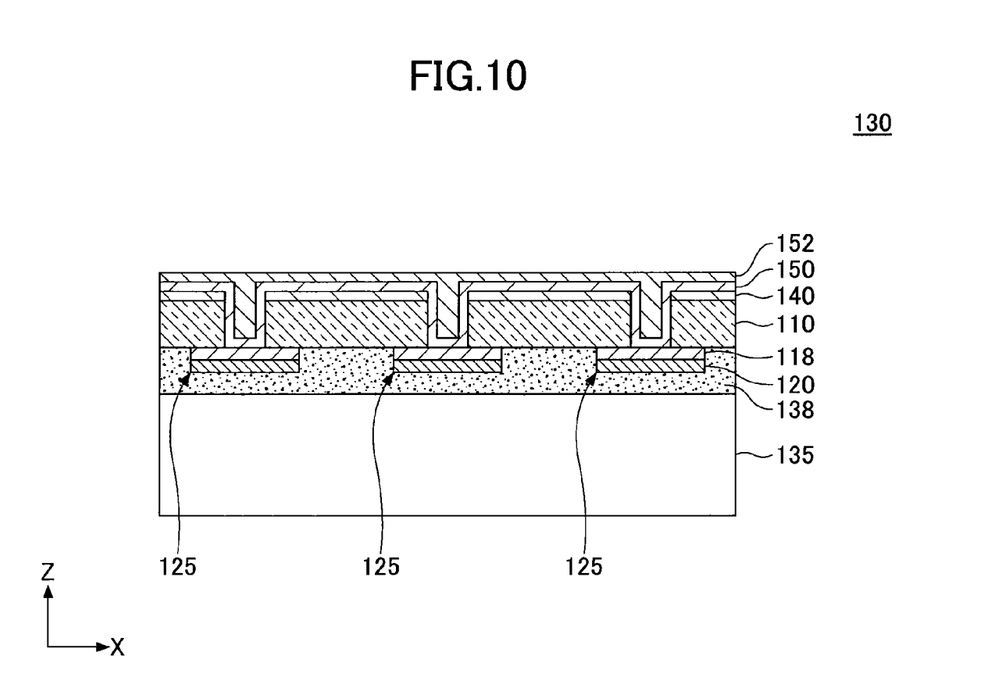
FIG. 10 is a drawing illustrating a step in the exemplary method of manufacturing a glass component.
Figure 11:
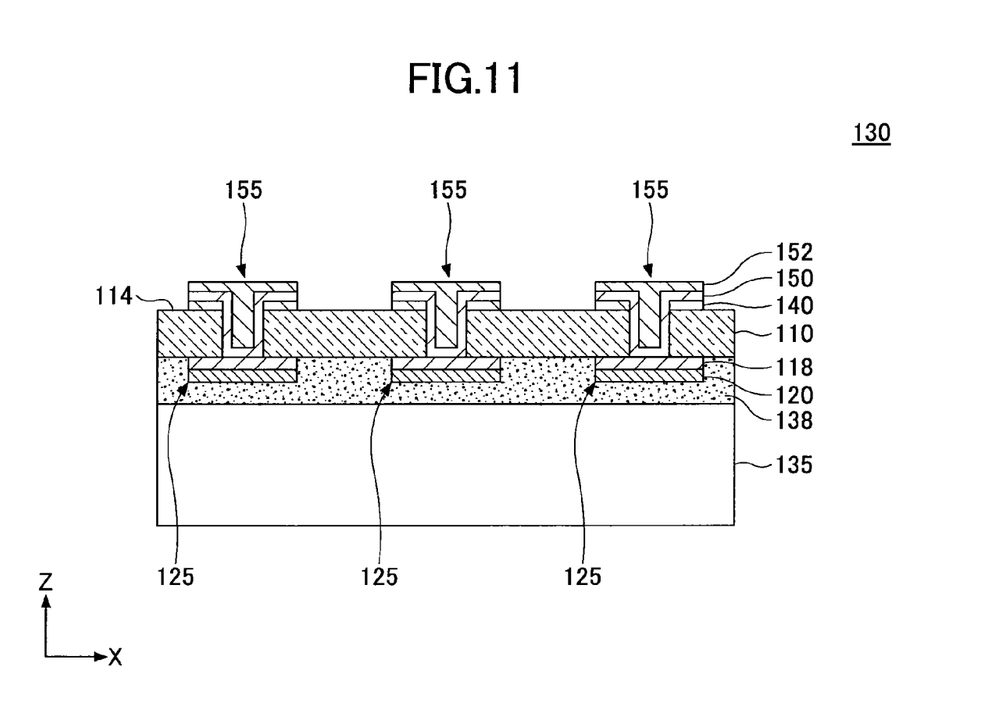
FIG. 11 is a drawing illustrating a step in the exemplary method of manufacturing a glass component.

FIGS. 9 through 11 illustrate step S160 where the second electric wires 155 are formed on the second surface 114 of the glass substrate 110.

As illustrated by FIG. 9, a middle conductive layer 150 is formed on the second surface 114 of the glass substrate 110. The middle conductive layer 150 is formed to cover the upper surface of the second seed layer 140 and the bottom and the side wall of each through hole 145.

Any appropriate material may be used for the middle conductive layer 150 as long as the material is conductive and has good adhesion to a second conductive layer to be formed on the middle conductive layer 150. For example, the middle conductive layer 150 may be comprised of a metal, a semiconductor, or a conductive oxide. Examples of metals include nickel, copper, and silver.

The middle conductive layer 150 may be formed by electroless plating or a general film forming method such as printing or dripping of a conductive paste or a conductive ink.

The thickness of the middle conductive layer 150 is not limited to a specific value. For example, the middle conductive layer 150 may have a thickness between 100 nm and 1000 nm.

Next, as illustrated by FIG. 10, a second conductive layer 152 is formed on the middle conductive layer 150. The second conductive layer 152 is formed to completely fill the through holes 145.

For example, the second conductive layer 152 may be comprised of a metal, a semiconductor, or an oxide (conductive oxide). Examples of metals include copper, silver, and nickel. Examples of oxides include indium tin oxide (ITO).

The second conductive layer 152 may be comprised of the same material as the first conductive layer 120. Also, the second conductive layer 152 may be comprised of the same material as the middle conductive layer 150.

The second conductive layer 152 may be formed by any film forming method. When the second conductive layer 152 is comprised of a metal, the second conductive layer 152 may be formed by electrolytic plating.

When the second conductive layer 152 is formed, the first conductive layer 120 disposed on the side of the first surface 112 of the glass substrate 110 and the second conductive layer 152 disposed on the side of the second surface 114 of the glass substrate 110 are electrically connected to each other via conductors (parts of the second conductive layer 152 and the middle conductive layer 150) filling the through holes 145.

Next, as illustrated by FIG. 11, the second conductive layer 152 is patterned together with the middle conductive layer 150 (and the second seed layer 140) to form a pattern of the second electric wires 155 on the second surface 114 of the glass substrate 110.

Similarly to the step of forming the first electric wires 125, the second conductive layer 152 may be patterned using a known wire patterning technique. For example, the second conductive layer 152 may be patterned by lithography using a resist.

Through the above step, the first electric wires 125 disposed on the first surface 112 of the glass substrate 110 and the second electric wires 155 disposed on the second surface 114 of the glass substrate 110 are electrically connected to each other via the conductors filling the through holes 145.

Here, at the stage where the second conductive layer 152 is patterned, the glass substrate 110 is joined to the support substrate 135 and the total thickness of the structure 130 is still greater than or equal to about 500 μm.

Therefore, the above described problem, where the dimensional stability of the glass substrate 110 is reduced due to the influence of, for example, the vibration of a processing apparatus and flexure of the glass substrate 110 itself, hardly occurs.

Accordingly, with the manufacturing method of the present embodiment, it is possible to accurately form a fine pattern of the second electric wires 155 on the second surface 114 of the glass substrate 110.

The width of the second electric wiring 155 (the length in the X direction in FIG. 11) may be, for example, between 2 μm and 5 μm. Also, the distance between adjacent second electric wires 155 may be, for example, between 2 μm and 5 μm.

<Step S170>

Next, the structure 130 is cut at predetermined positions to produce cut parts 131.

Figure 12:
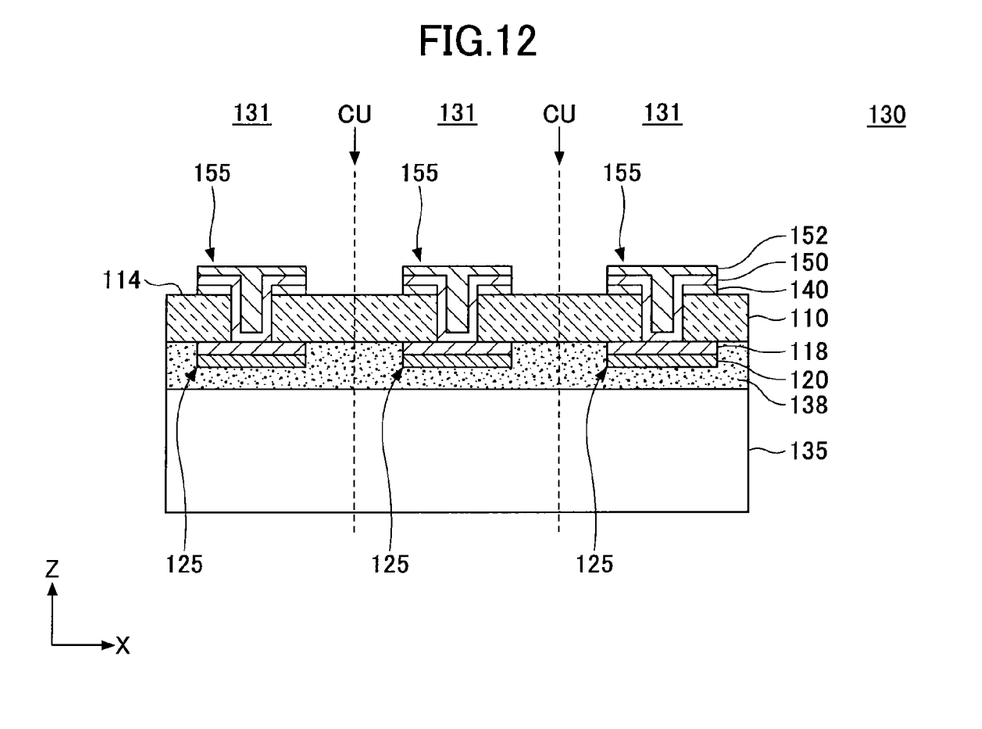
FIG. 12 is a drawing illustrating a step in the exemplary method of manufacturing a glass component.
Figure 13:
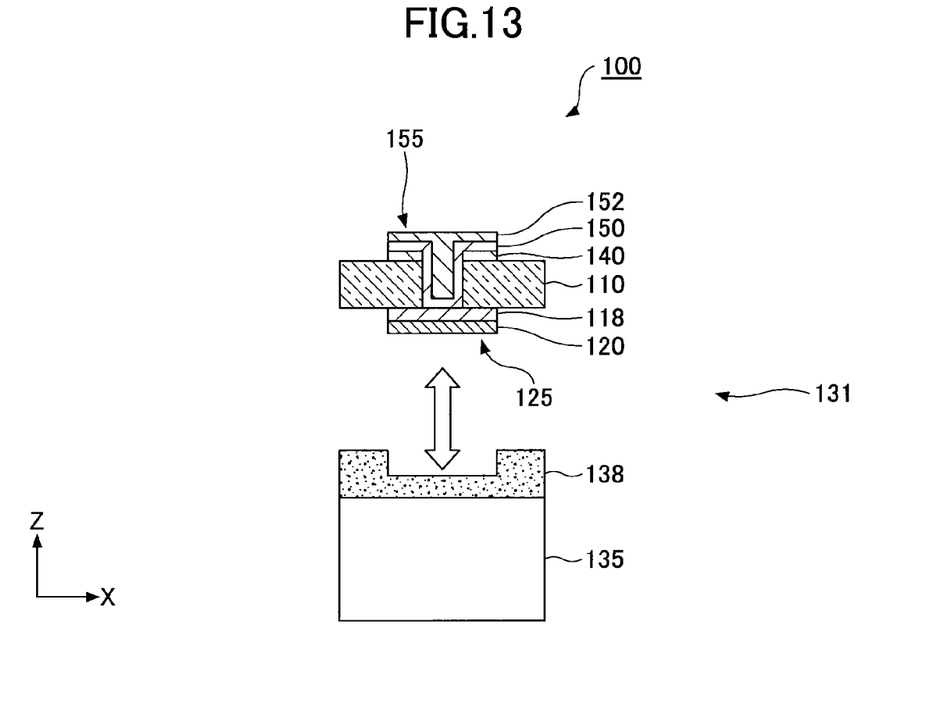
FIG. 13 is a drawing illustrating a step in the exemplary method of manufacturing a glass component.

FIG. 12 illustrates a step of cutting the structure 130 to produce three cut parts 131.

As illustrated by FIG. 12, the structure 130 is cut at positions indicated by dotted lines CU. As a result, the cut parts 131 are obtained. In each cut part 131, the first electric wire 125 and the second electric wire 155 are electrically connected to each other via the through hole 145.

Any appropriate method may be used to cut the structure 130. For example, the structure 130 may be cut by dicing.

As described above, step S170 may instead be performed after step S180. Also, step S170 may be omitted if it is not necessary.

<Step S180>

Next, the glass substrate 110 including the first electric wire 125 and the second electric wire 155 is separated from the resin layer 138 and the support substrate 135 of each cut part 131. As a result, a glass component 100 including the first electric wire 125 and the second electric wire 155 is obtained.

Any appropriate method may be used to separate the glass component 100 from the cut part 131. For example, the glass component 100 may be separated from the cut part 131 by softening the resin layer 138 by heating the cut part 131. Also, the glass component 100 may be mechanically separated from the cut part 131. Further, the glass component 100 may be separated from the cut part 131 by irradiating the resin layer 138 with a laser beam and thereby causing the resin layer 138 to deteriorate with heat.

Any other appropriate methods may also be used to separate the glass component 100 from the cut part 131.

Through the above process, the glass component 100 of the present embodiment can be manufactured. As described above, the manufacturing method of the present embodiment makes it possible to manufacture a glass component including a significantly-thin glass substrate having a thickness of, for example, between 10 μm and 80 μm, and a fine electric wire formed and accurately positioned on at least one surface of the glass substrate.

The manufacturing method of the present embodiment described above is an example of a method for manufacturing the glass component 100. The manufacturing method for manufacturing the glass component 100 may be modified in any appropriate manner.

For example, although the second seed layer 140 is formed on the second surface 114 before the through holes 145 are formed in the glass substrate 110 at step S150 in the above described method, the second seed layer 140 may instead be formed after the through holes 145 are formed in the glass substrate 110. In this case, the second seed layer 140 is formed also on the bottom and the side wall of each through hole 145 in addition to the second surface 114 of the glass substrate 110. That is, the second seed layer 140 may be formed to have a shape similar to the shape of the middle conductive layer 150 illustrated in FIG. 9.

Also, in some cases such as a case where the middle conductive layer 150 is formed by electroless plating, the second seed layer 140 may be omitted.

Also in the above described method, the through holes 145 are filled with the middle conductive layer 150 and the second conductive layer 152 at step S160. Alternatively, the through holes 145 may be filled with another conductor. That is, a step of filling the through holes 145 with another conductor may be performed before step S160.

In the above described method, the first and second electric wires 125 and 155 formed at steps S120 and S160 are fine wires with a width of, for example, between 2 μm and 5 μm. However, some products for which the glass component 100 is used may require a fine wire only on one surface of the glass substrate 110. When the glass component 100 is used for such products, one of the first and second electric wires 125 and 155 formed at steps S120 and S160 may not necessarily be a fine wire.

Various other modifications may be also be made to the manufacturing method described above.

<<Glass Component>>

Next, a glass component according to an embodiment is described with reference to FIG. 14.

Figure 14:
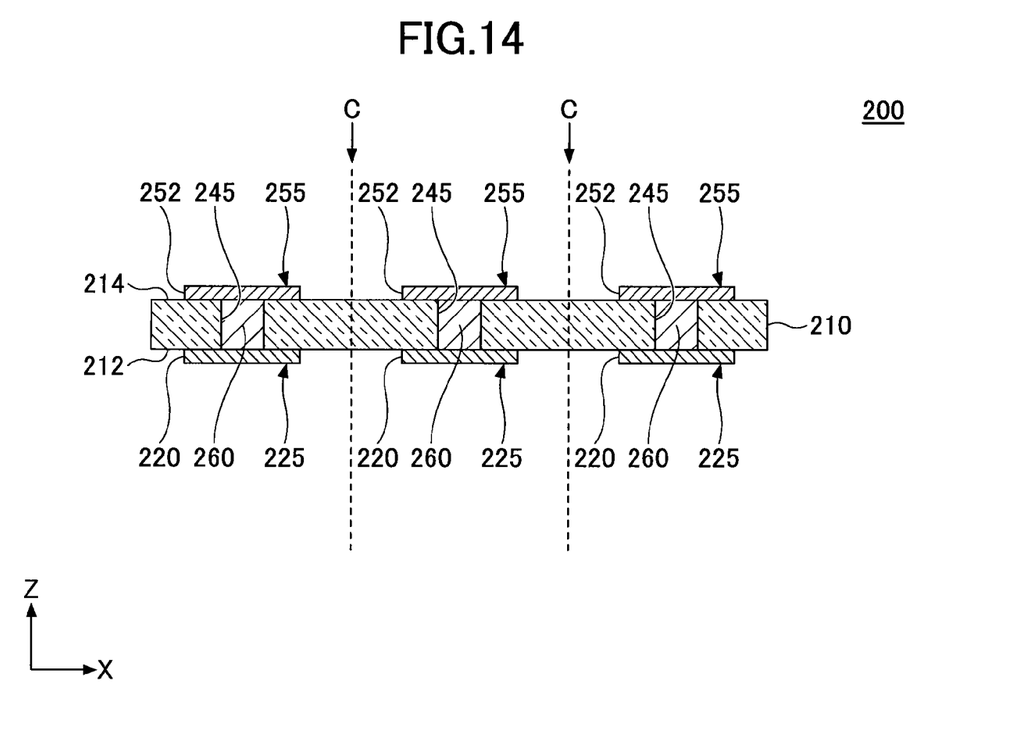
FIG. 14 is a drawing illustrating an exemplary configuration of a glass component.

FIG. 14 illustrates a glass component 200 according to an embodiment.

As illustrated by FIG. 14, the glass component 200 includes a glass substrate 210 including first and second surfaces 212 and 214. First electric wires 225 are formed on the first surface 212 of the glass substrate 210, and second electric wires 255 are formed on the second surface 214 of the glass substrate 210.

The glass substrate 210 also includes one or more through holes 245 that pass through the glass substrate 210 from the first surface 212 to the second surface 214. Each of the through holes 245 is filled with a conductor 260. In top view of the glass component 200, the through holes 245 are disposed to overlap the first and second electric wires 225 and 255. Accordingly, each first electric wire 225 is electrically connected to the corresponding second electric wire 255 via the conductor 260 filling the through hole 245.

The first electric wire 225 includes a first conductive layer 220, and the second electric wire 255 includes a second conductive layer 252.

In the example of FIG. 14, the glass component 200 includes three through holes 245. However, this is just an example, and the glass component 200 may include one, two, or four or more through holes 245. For example, three glass components, each of which includes one through hole 245, may be obtained by cutting the glass component 200 at dotted lines C.

The thickness of the glass substrate 210 of the glass component 200 is preferably between 10 μm and 80 μm. More preferably, the thickness of the glass substrate 210 is between 40 μm and 60 μm.

In the glass component 200, at least one of the first electric wire 225 and the second electric wire 255 is a fine wire with a width between 2 μm and 5 μm. Also, the distance between adjacent wires in at least one of the first electric wires 225 and the second electric wires 255 may be between 2 μm and 5 μm.

Because the thickness of the glass substrate 210 is small, the thickness of the glass component 200 is also small. Accordingly, using the glass component 200 for a product such as an electronic device or an electronic apparatus makes it possible to reduce the size of the product and reduce the space occupied by the product. Also in the glass component 200, at least one of the first electric wire 225 and the second electric wire 255 is an accurately-formed fine wire. Therefore, using the glass component 200 for a product such as an electronic device or an electronic apparatus makes it possible to significantly improve the performance of the product.

<<Constituents of Glass Component>>

Next, constituents of a glass component of an embodiment are described using the glass component 200 as an example.

<Glass Substrate>

The glass substrate 210 may have a thickness between 10 μm and 80 μm. Any appropriate material may be used for the glass substrate 210.

<First and Second Electric Wires>

The first electric wire 225 may be composed of a single conductive layer, i.e., the first conductive layer 220, as illustrated in FIG. 14. Alternatively, the first electric wire 225 may be composed of multiple layers. When the first electric wire 225 is composed only of the first conductive layer 220, the first conductive layer 220 may be comprised of a conductive material such as a metal, a semiconductor, a conductive oxide, or a conductive resin.

On the other hand, when the first electric wire 225 is composed of multiple layers, at least one of the layers needs to be a conductive layer that is electrically connected to the conductor 260 filling the through hole 245.

The above description also applies to the second electric wire 255.

Figure 15:
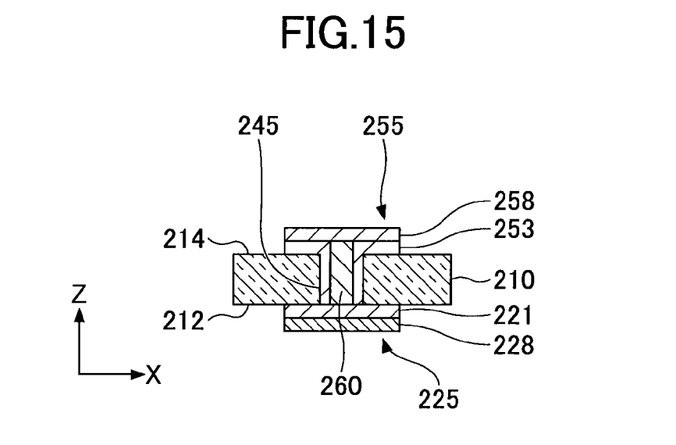
FIG. 15 is a drawing illustrating other exemplary configurations of first and second electric wires.

FIG. 15 illustrates exemplary configurations of the first electric wire 225 and the second electric wire 255 composed of multiple layers.

In the example of FIG. 15, the first electric wire 225 includes a first lower layer 221 and a first upper layer 228 formed on the first lower layer 221. Similarly, the second electric wire 255 includes a second lower layer 253 and a second upper layer 258 formed on the second lower layer 253.

The first lower layer 221, the first upper layer 228, and the second upper layer 258 are conductive layers. The first upper layer 228 and the second upper layer 258 are electrically connected to each other via the first lower layer 221 and a conductor 260 filling a through hole 245. The conductor 260 filling the through hole 245 may be a part of the second upper layer 258.

On the other hand, the second lower layer 253 of the second electric wire 255 may be either a conductive layer or an insulating layer. The second lower layer 253 covers a part of the second surface 214 of the glass substrate 210 and the side wall of the through hole 245. When the second lower layer 253 is a conductive layer, the second lower layer 253 may be comprised of the same material as the conductor 260.

The first electric wire 225 and the second electric wire 255 may have configurations as described above.

<Through Hole>

The through hole 245 may have various dimensions and shapes. For example, a cross section of the through hole 245 in a direction perpendicular to the length direction of the through hole 245 may have a circular, elliptical, rectangular, or triangular shape. Also, the maximum dimension of the cross section may be between 10 μm and 50 μm. Here, the "maximum dimension" of the cross section of the through hole 245 indicates, for example, the diameter of a circle, the length of the major axis of an ellipse, or the maximum length of a diagonal of a triangle or a rectangle, depending on the shape of the cross section.

When the component 200 includes multiple through holes 245, a distance d (or a pitch) between the through holes 245 may be set at any appropriate value. For example, the distance d may be between 20 μm and 500 μm.

Also, the through hole 245 may have a tapered shape in which its cross-sectional dimension gradually decreases from one end of the through hole 245 to the other end.

The conductor 260 filling the through hole 245 may be comprised of any conductive material. For example, the conductor 260 may include a metal such as copper, nickel, gold, platinum, or titanium, and/or a conductive oxide or a conductive resin.

Also, the conductor 260 may include a material that is the same as a material included in one of the first electric wire 225 and the second electric wire 255.

<<Application of Glass Component>>

The glass component 200 according to the present embodiment is described above with reference to FIGS. 14 and 15.

The glass component 200 of the present embodiment may be used for various apparatuses and devices. For example, the glass component 200 may be used for a display apparatus such as a thin film transistor (TFT) display, a sensor such as a fingerprint sensor, and a glass interposer.

Using the glass component 200 for such an apparatus makes it possible to reduce the size of wiring of the apparatus and thereby reduce the space occupied by the wiring. Also, using the glass component 200 for such an apparatus makes it possible to increase the density and improve the performance of the apparatus.

Figure 16:
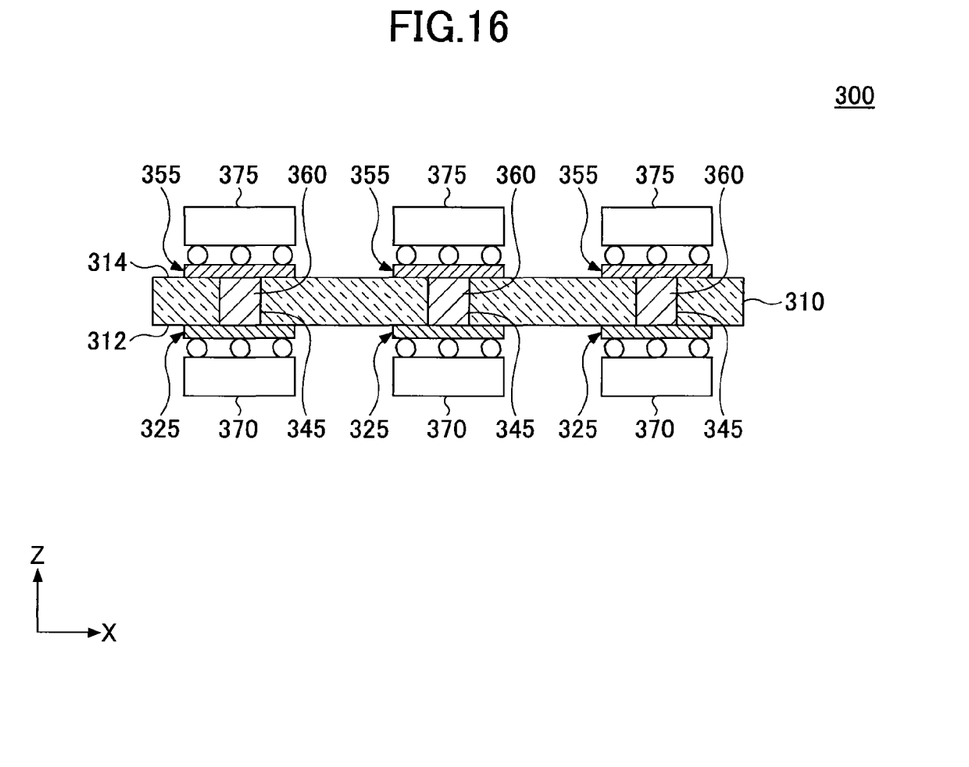
FIG. 16 is a drawing illustrating an exemplary configuration of a glass interposer.

FIG. 16 is a drawing illustrating an exemplary configuration of a glass interposer 300 for which a glass component according to an embodiment of the present invention is used.

As illustrated by FIG. 16, the glass interposer 300 includes a glass substrate 310 including a first surface 312 and a second surface 314.

The glass substrate 310 includes multiple through holes 345 each of which is filled with a conductor 360. First electric wires 325 are formed on the first surface 312 of the glass substrate 310, and second electric wires 355 are formed on the second surface 314 of the glass substrate 310. The first electric wire 325 and the second electric wire 355 of each pair are electrically connected to each other via the conductor 360 filling the through hole 345.

The glass interposer 300 also includes first electronic components 370 disposed on the side of the first surface 312 of the glass substrate 310 and second electronic components 375 disposed on the side of the second surface 314 of the glass substrate 310.

Each first electronic component 370 is electrically connected to the first electric wire 325, and each second electronic component 370 is electrically connected to the second electric wire 355. Accordingly, the first electronic component 370 and the second electronic component 375 are electrically connected to each other via the conductor 360 in the through hole 345.

In the glass interposer 300, the glass substrate 310 has a thickness between 10 μm and 80 μm. Also, at least one of the first electric wire 325 and the second electric wire 355 has a width between 2 μm and 5 μm.

Because a thin glass substrate 310 is used, the size of and the space occupied by the glass interposer 300 can be reduced. Also, at least one of the first electric wire 325 and the second electric wire 355 of the glass interposer 300 is an accurately-formed fine wire. Accordingly, the glass interposer 300 can provide high performance with a small size.

An aspect of this disclosure provides a method of manufacturing a glass component. The method makes it possible to form a fine electric wire on at least one surface of a thin glass substrate of the glass component. Another aspect of this disclosure provides a glass component including a thin glass substrate and a fine electric wire on at least one surface of the glass substrate.

This disclosure may be applied to a glass component such as a glass interposer.

A glass component, a method of manufacturing the glass component, and a glass interposer according to embodiments of the present invention are described above. However, the present invention is not limited to the specifically disclosed embodiments, and variations and modifications may be made without departing from the scope of the present invention.

What is claimed is:

1. A method of manufacturing a glass component, the method comprising in the following order:

preparing a glass substrate including a first surface and a second surface and having a thickness of at least 300 μm;

forming first electric wires on the first surface of the glass substrate;

forming a structure by joining the glass substrate via a resin layer to a support substrate such that the first surface of the glass substrate, which has the first electric wires on the first surface, faces the resin layer;

thinning the glass substrate from the second surface towards the first surface to a thickness of from 10 μm to 80 μm;

forming through holes in the glass substrate by irradiating the glass substrate from the second surface with a laser beam;

forming second electric wires on the second surface of the glass substrate such that the second electric wires are electrically connected to the corresponding first electric wires via conductors filling the through holes;

separating the glass substrate from the support substrate; and cutting the glass component at predetermined positions in a vertical direction after forming the second electric wires and before or after separating the glass substrate from the support substrate, thereby obtaining glass components each comprising a first electric wire of the formed first electric wires and a corresponding second electric wire of the formed second electric wires.

2. The method as claimed in claim 1, wherein the forming of the first electric wires comprises:

forming a first seed layer on the first surface of the glass substrate;

forming a first conductive layer on the first seed layer; and patterning the first seed layer and the first conductive layer disposed on the first surface.

3. The method as claimed in claim 1, wherein the forming of the second electric wires comprises forming a second seed layer on the second surface of the glass substrate;

forming a second conductive layer on the second seed layer; and patterning the second seed layer and the second conductive layer disposed on the second surface.

4. The method as claimed in claim 1, wherein the first electric wires are formed to have a width of from 2 μm to 5 μm.

5. The method as claimed in claim 1, wherein the second electric wires are formed to have a width of from 2 μm to 5 μm.

6. The method as claimed in claim 1, wherein the glass substrate is thinned by selectively etching the second surface.

7. The method as claimed in claim 1, wherein the through holes are filled with the conductors comprised of a material that is the same as a material of the second electric wires.

8. The method as claimed in claim 1, wherein the through holes are formed so as not to pass through the first electric wires.

9. The method as claimed in claim 1, wherein the first electric wires are embedded into the resin layer.

10. The method as claimed in claim 2, wherein the through holes do not pass through the first conductive layer of the first wires.

* * * * *